(12) United States Patent
Miura (10) Patent No.: US 7,622,741 B2
(45) Date of Patent: Nov. 24, 2009

(54) SEMICONDUCTOR DEVICE AND METHOD FOR MANUFACTURING SAME

(75) Inventor: Mineo Miura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 84 days.

(21) Appl. No.: 10/588,103

(22) PCT Filed: Feb. 25, 2005

(86) PCT No.: PCT/JP2005/003671

§ 371 (c)(1),
(2), (4) Date: Jul. 31, 2006

(87) PCT Pub. No.: WO2005/083796

PCT Pub. Date: Sep. 9, 2005

(65) Prior Publication Data

US 2007/0145377 A1     Jun. 28, 2007

(30) Foreign Application Priority Data

Feb. 27, 2004   (JP)   ............... 2004/054506

(51) Int. Cl.
   *H01L 31/0312* (2006.01)
(52) U.S. Cl. ............ 257/77; 257/335; 257/548; 257/549; 257/E21.056; 257/E21.054; 257/E21.065
(58) Field of Classification Search .............. None
   See application file for complete search history.

(56) References Cited

U.S. PATENT DOCUMENTS

| | | | |
|---|---|---|---|
| 4,827,319 A * | 5/1989 | Pavlidis et al. | ............... 257/480 |
| 5,976,936 A | 11/1999 | Miyajima et al. | |
| 6,020,600 A | 2/2000 | Miyajima et al. | |
| 6,373,102 B1 * | 4/2002 | Huang | ........................ 257/345 |
| 6,573,534 B1 * | 6/2003 | Kumar et al. | ................. 257/77 |
| 6,639,273 B1 | 10/2003 | Ueno | |
| 2002/0038891 A1 | 4/2002 | Ryu | |
| 2002/0172774 A1 | 11/2002 | Lipkin | |
| 2004/0036113 A1 | 2/2004 | Ueno | |

(Continued)

FOREIGN PATENT DOCUMENTS

CN      1478302 A      2/2004

(Continued)

OTHER PUBLICATIONS

U.S. Appl. No. 60/237,426, filed Oct. 3, 2000, Anant Agarwal.

(Continued)

*Primary Examiner*—Minh-Loan T Tran
*Assistant Examiner*—Fei Fei Yeung Lopez
(74) *Attorney, Agent, or Firm*—Rabin & Berdo, P.C.

(57) ABSTRACT

A semiconductor device of a double diffused MOS structure employing a silicon carbide semiconductor substrate. The semiconductor device comprises a silicon carbide semiconductor epitaxial layer provided on a surface of the silicon carbide semiconductor substrate and having a first conductivity which is the same conductivity as the silicon carbide semiconductor substrate, and an impurity region formed by doping a surface portion of the silicon carbide semiconductor epitaxial layer with an impurity of a second conductivity, the impurity region having a profile such that a near surface thereof has a relatively low second-conductivity impurity concentration and a deep portion thereof has a relatively high second-conductivity impurity concentration.

8 Claims, 6 Drawing Sheets

U.S. PATENT DOCUMENTS

2004/0119076 A1* 6/2004 Ryu .......................... 257/77
2004/0159886 A1* 8/2004 Lee et al. .................. 257/331

FOREIGN PATENT DOCUMENTS

| JP | 9-503626 | 4/1997 |
| JP | 10-308510 | 11/1998 |
| JP | 11-261061 | 9/1999 |
| JP | 2000-82812 | 3/2000 |
| JP | 2000-150866 | 5/2000 |
| WO | WO 02/29900 A2 | 4/2002 |

OTHER PUBLICATIONS

U.S. Appl. No. 60/237,822, filed Oct. 3, 2000, Lori Lipkin.
U.S. Appl. No. 60/294,307, filed May 30, 2001, Lori Lipkin.

* cited by examiner

SEMICONDUCTOR DEVICE AND METHOD FOR MANUFACTURING SAME

TECHNICAL FIELD

The present invention relates to a semiconductor device of a double diffused MOS structure employing a silicon carbide semiconductor substrate, and a manufacturing method for the semiconductor device.

BACKGROUND ART

In a double diffused MOS (DMOS) FET employing a silicon carbide (SiC) semiconductor substrate, an $n^-$-type SiC semiconductor epitaxial layer is provided on a surface of an $n^+$-type SiC semiconductor substrate. A p-type impurity region is provided in a surface portion of the $n^-$-type SiC semiconductor epitaxial layer, and an $n^+$-type impurity region having an annular shape as seen in plan is provided in the p-type impurity region.

Figure 7:
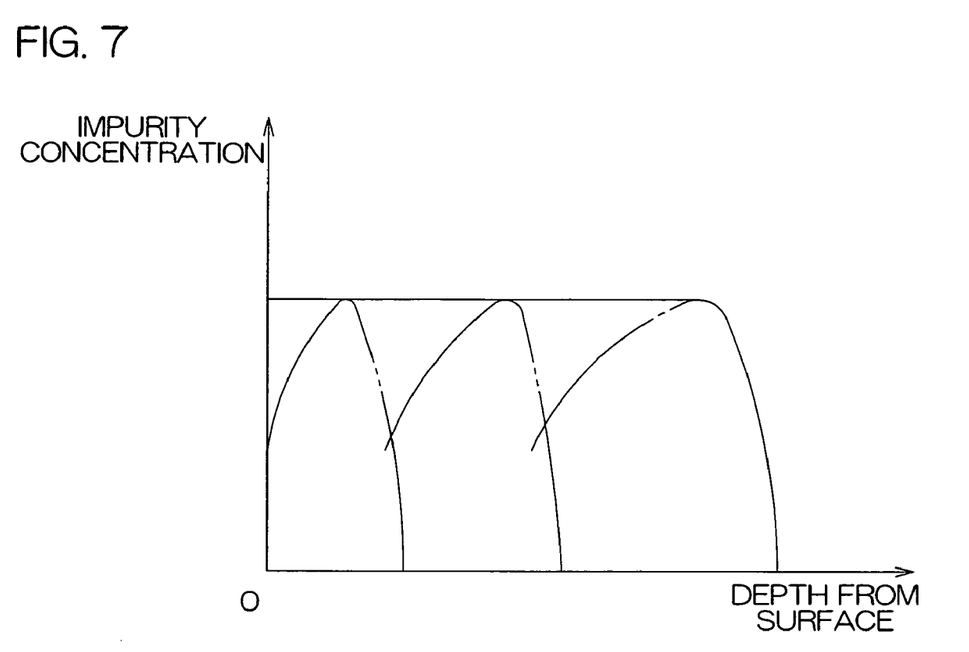
FIG. 7 is a diagram illustrating an impurity profile of a p-type impurity region of a prior-art double diffused MOSFET.

FIG. 7 is a diagram illustrating an impurity profile in the p-type impurity region in the prior-art double diffused MOSFET. In the prior-art double diffused MOSFET, the p-type impurity region has a so-called box profile. That is, the profile in the p-type impurity region in the prior-art double diffused MOSFET is controlled as having a generally uniform impurity concentration irrespective of the depth from the surface of the p-type impurity region.

The p-type impurity region having such a box profile is formed by implanting a p-type impurity into the surface portion of the $n^-$-type SiC semiconductor epitaxial layer by multi-step ion implantation. Ion implantation performed with constant implantation energy (single-step ion implantation) provides a depthwise impurity distribution approximate to the Gaussian distribution (as indicated by two-dot-and-dash lines in FIG. 7). Therefore, by performing ion implantation with three different levels of implantation energy (three-step ion implantation), for example, a near surface of the p-type impurity region and the deepest portion of the p-type impurity region (on a boundary between the p-type impurity region and the $n^-$-type SiC semiconductor epitaxial layer) are allowed to have substantially the same impurity concentration.

When the deep portion of the p-type impurity region has a lower impurity concentration, a depletion layer is liable to spread into the p-type impurity region from the boundary between the p-type impurity region and the $n^-$-type SiC semiconductor epitaxial layer, so that punch-through is liable to occur. Therefore, a breakdown voltage of the prior-art double diffused MOSFET is sufficiently increased by setting the impurity concentration of the p-type impurity region at a high level on the order of $10^{17}$ to $10^{18}/cm^3$. However, where the p-type impurity region has a high impurity concentration, carriers moving in a channel region are liable to be scattered. This disadvantageously reduces the carrier mobility in the channel (increases the ON resistance).

DISCLOSURE OF THE INVENTION

It is therefore an object of the present invention to provide a semiconductor device having a structure which ensures both a higher breakdown voltage for suppression of punch-through and an improved carrier mobility in a channel at the same time, and to provide a manufacturing method of the semiconductor device.

A semiconductor device according to the present invention is a semiconductor device of a double diffused MOS structure employing a silicon carbide semiconductor substrate. The semiconductor device comprises a silicon carbide semiconductor epitaxial layer provided on a surface of the silicon carbide semiconductor substrate and having a first conductivity which is the same conductivity as the silicon carbide semiconductor substrate, and an impurity region formed by doping a surface portion of the silicon carbide semiconductor epitaxial layer with an impurity of a second conductivity, the impurity region having a profile such that a near surface thereof has a relatively low second-conductivity impurity concentration and a deep portion thereof has a relatively high second-conductivity impurity concentration.

With this arrangement, the deep portion of the impurity region has a higher second-conductivity impurity concentration, so that a depletion layer is prevented from spreading into the impurity region from a boundary between the impurity region and the underlying silicon carbide semiconductor epitaxial layer. On the other hand, the near surface of the impurity concentration, so that carriers moving in a channel region formed in a surface portion of the impurity region are less liable to be scattered. Thus, the mobility of the carriers in the channel can be kept high. This makes it possible to ensure both a high breakdown voltage for suppression of punch-through and an improved carrier mobility in the channel at the same time.

The profile of the impurity region is preferably such that a near deepest portion of the impurity region (adjacent to the boundary between the impurity region and the silicon carbide semiconductor epitaxial layer) has a high peak second-conductivity impurity concentration on the order of not lower than $10^{18}/cm^3$ and the second-conductivity impurity concentration continuously and gently decreases from the peak concentration level in the near deepest portion toward the near surface of the impurity region in which the second-conductivity impurity concentration is not higher than $5 \times 10^{15}/cm^3$.

A second-conductivity impurity concentration in an outermost surface portion of the impurity region is preferably controlled to be lower than a first-conductivity impurity concentration in the silicon carbide semiconductor epitaxial layer. Thus, the second-conductivity impurity concentration in the outermost surface portion of the impurity region is lower than the first-conductivity impurity concentration in the silicon carbide semiconductor epitaxial layer, so that an accumulation MOSFET structure can be provided in which a first conductivity appears in the surface portion (channel region) of the impurity region and the channel region of the first conductivity serves as an accumulation layer. Therefore, a threshold voltage is reduced, and the carrier mobility in the channel is further improved.

A semiconductor device manufacturing method according to the present invention is a method for manufacturing a semiconductor device of a double diffused MOS structure employing a silicon carbide semiconductor substrate. The method comprises steps of: forming a silicon carbide semiconductor epitaxial layer having a first conductivity on a surface of the silicon carbide semiconductor substrate, the first conductivity being the same conductivity as the silicon carbide semiconductor substrate; and doping a surface portion of the silicon carbide semiconductor epitaxial layer with an impurity of a second conductivity to form an impurity region having a profile such that a near surface thereof has a relatively low second-conductivity impurity concentration and a deep portion thereof has a relatively high second-conductivity impurity concentration.

The semiconductor device described above can be manufactured by this method.

The impurity region having the profile with the second-conductivity impurity concentration being relatively low in the near surface thereof and relatively high in the deep portion thereof can be formed by doping the surface portion of the silicon carbide semiconductor epitaxial layer with the impurity of the second conductivity by single-step ion implantation.

In the impurity region forming step, the impurity region is preferably formed as having a profile such that a second-conductivity impurity concentration in an outermost surface portion thereof is lower than a first-conductivity impurity concentration in the silicon carbide semiconductor epitaxial layer. Thus, the semiconductor device can be manufactured in which the second-conductivity impurity concentration in the outermost surface portion of the impurity region is controlled to be lower than the first-conductivity impurity concentration in the silicon carbide semiconductor epitaxial layer.

The foregoing and other objects, features and effects of the present invention will become more apparent from the following description of embodiments with reference to the attached drawings.

BEST MODE FOR IMPLEMENTING THE INVENTION

Figure 1:
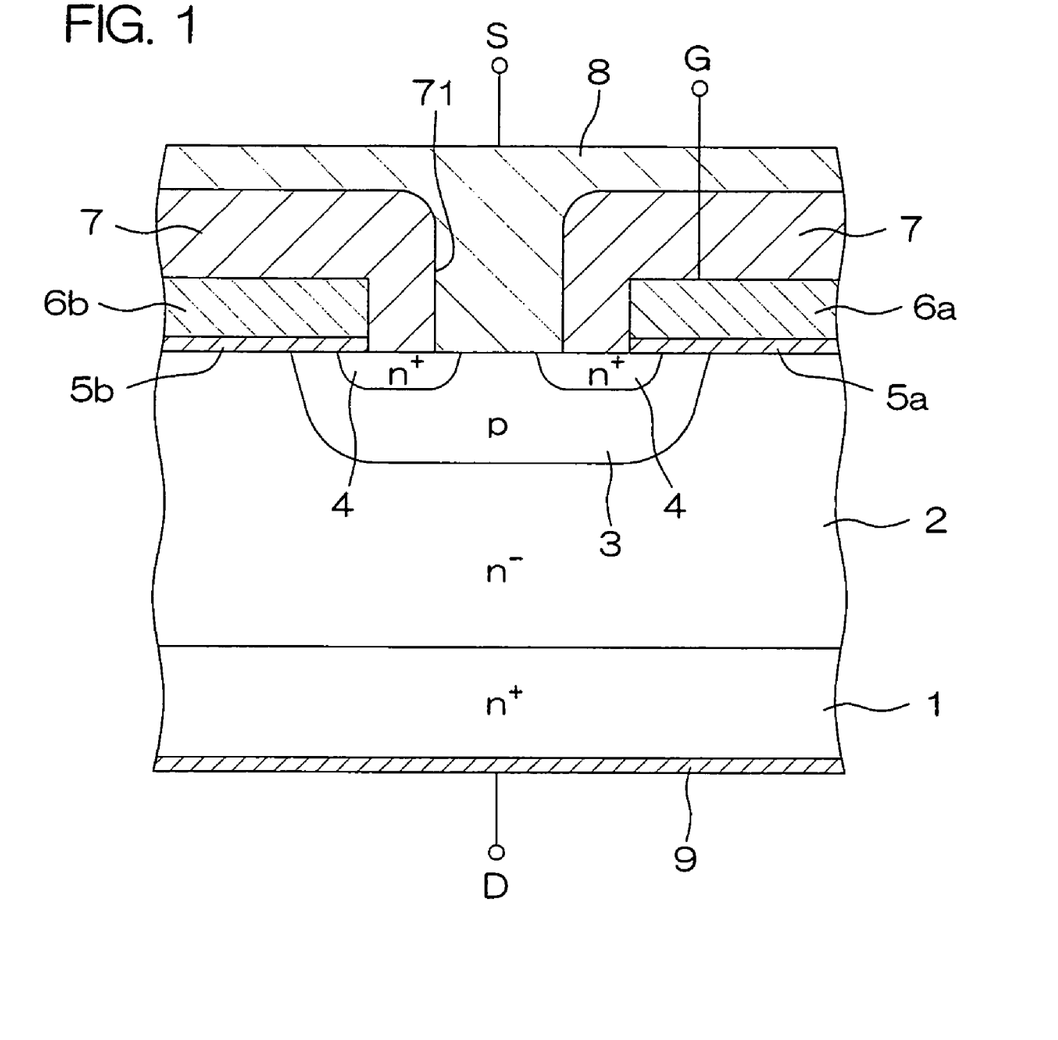
FIG. 1 is a sectional view schematically illustrating a construction of a semiconductor device according to an embodiment of the present invention.

FIG. 1 is a sectional view schematically illustrating a construction of a semiconductor device according to an embodiment of the present invention. The semiconductor device is a double diffused MOSFET, and employs an n$^+$-type SiC semiconductor substrate 1 as a semiconductor substrate.

An n$^-$-type SiC semiconductor epitaxial layer 2 having a lower impurity concentration than the n$^+$-type SiC semiconductor substrate 1 is provided on a surface of the n$^+$-type SiC semiconductor substrate 1. A p-type impurity region 3 having a rectangular shape as seen in plan, for example, is provided in a surface portion of the n$^-$-type SiC semiconductor epitaxial layer 2. Further, an n$^+$-type impurity region 4 having a rectangular frame shape as seen in plan is provided in the p-type impurity region 3 in properly spaced relation from peripheral edges of the p-type impurity region 3. The p-type impurity region 3 has a depth of 0.5 to 0.7 μm from a surface of the n$^-$-type SiC semiconductor epitaxial layer 2. The n$^+$-type impurity region 4 has a depth of 0.2 to 0.3 μm from the surface of the n$^-$-type SiC semiconductor epitaxial layer 2. A portion of the p-type impurity region 3 present below the n$^+$-type impurity region 4 has a thickness of at least 0.2 to 0.3 μm.

Gate oxide films 5a, 5b and gate electrodes 6a, 6b are provided on the n$^-$-type SiC semiconductor epitaxial layer 2. The gate oxide films 5a, 5b are each linearly provided along one of the peripheral edges of the p-type impurity region 3 (n$^+$-type impurity region 4) as spanning an area between an outer peripheral portion of the n$^+$-type impurity region 4 and the outside of the p-type impurity region 3. The gate oxide films 5a, 5b each cover a portion of the surface of the n$^-$-type SiC semiconductor epitaxial layer 2 between the outer peripheral edge portion of the n$^+$-type impurity region 4 and the outside of the p-type impurity region 3. The gate electrodes 6a, 6b are respectively provided on the gate oxide films 5a, 5b.

An inter-layer insulation film 7 is provided over the gate electrodes 6a, 6b. A source electrode 8 having, for example, a rectangular shape as seen in plan is provided over the inter-layer insulation film 7. The source electrode 8 is connected to a source contact region including an inner peripheral portion of the n$^+$-type impurity region 4 and a region of the p-type impurity region 3 surrounded by the n$^+$-type impurity region 4 via a contact hole 71 formed in the inter-layer insulation film 7.

A drain electrode 9 is provided on a rear side of the n$^+$-type SiC semiconductor substrate 1 (opposite from the n$^-$-type SiC semiconductor epitaxial layer 2) as covering the entire rear surface.

Figure 2:
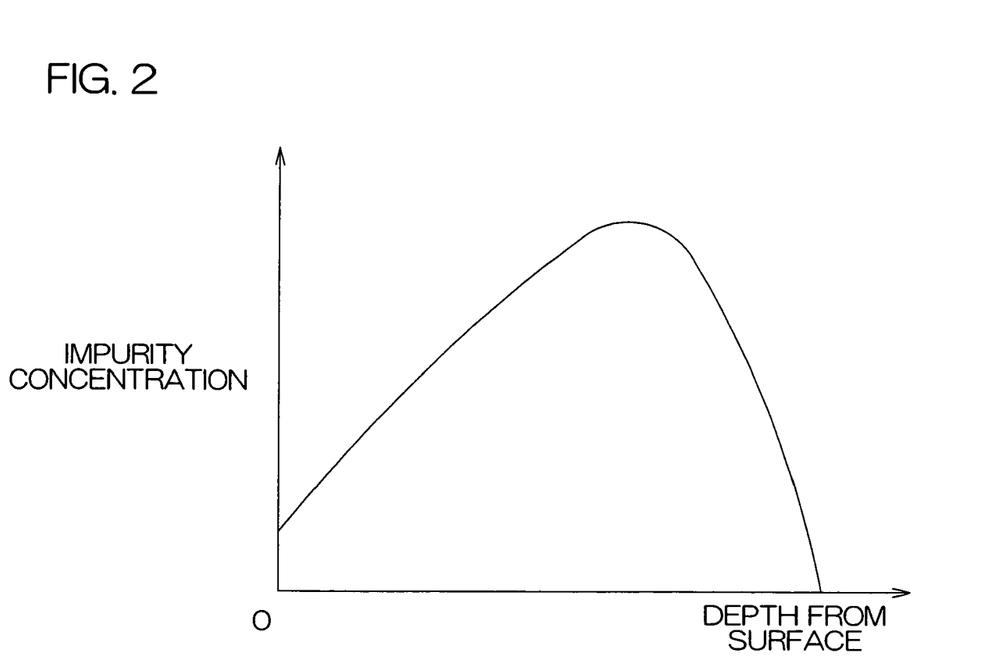
FIG. 2 is a diagram illustrating an impurity profile of a p-type impurity region of the semiconductor device.

FIG. 2 is a diagram illustrating an impurity profile of the p-type impurity region 3. The p-type impurity region 3 is formed by forming the n$^-$-type SiC semiconductor epitaxial layer 2 on the surface of the n$^+$-type SiC semiconductor substrate 1 by epitaxial growth and then implanting, for example, aluminum (Al) ions as the p-type impurity into the surface portion of the n$^-$-type SiC semiconductor epitaxial layer 2 with an implantation energy of 400 keV (constant). That is, the formation of the p-type impurity region 3 is achieved by single-step ion implantation with an implantation energy of 400 keV.

The p-type impurity region 3 thus formed has an impurity profile such that a near deepest portion thereof (adjacent to a boundary between the p-type impurity region and the n$^-$-type SiC semiconductor epitaxial layer 2) present at a depth of 0.5 to 0.7 μm has a high peak p-type impurity concentration on the order of not lower than $10^{18}$/cm$^3$ and the p-type impurity concentration continuously and gently decreases from the peak concentration level in the near deepest portion toward a near surface in which the p-type impurity concentration is not higher than $5 \times 10^{15}$/cm$^3$, because the impurity introduced into the n$^-$-type SiC semiconductor epitaxial layer 2 partly collides on SiC crystals to be reflected back.

Figure 3:
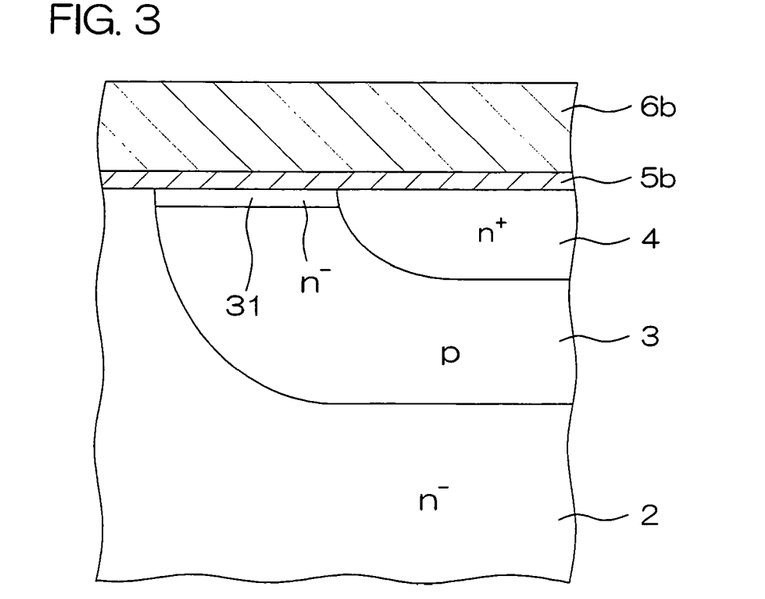
FIG. 3 is a sectional view schematically illustrating a construction of an accumulation MOSFET.

Since the impurity concentration is high in a deep portion of the p-type impurity region 3, a depletion layer is prevented from spreading into the p-type impurity region 3 from the boundary between the p-type impurity region 3 and the underlying n$^-$-type SiC semiconductor epitaxial layer 2. On the other hand, the impurity concentration is low in the near surface of the p-type impurity region 3, so that carriers moving in a channel region formed in a surface portion of the p-type impurity region 3 are less liable to be scattered. Thus, mobility of the carriers in the channel can be kept high. Therefore, the double diffused MOSFET structure ensures both a high breakdown voltage for suppression of punch-through and an improved carrier mobility in the channel at the same time.

Where a p-type impurity concentration in an outermost surface portion of the p-type impurity region 3 is lower than the n-type impurity concentration of the n$^-$-type SiC semiconductor epitaxial layer 2 (e.g., $10^{16}$/cm$^3$), an accumulation MOSFET structure can be provided in which an n⁻-type conductivity appears, as shown in FIG. 3, in the surface portion (channel region) of the p-type impurity region 3 and the n⁻-type channel region serves as an accumulation layer 31. Therefore, the carrier mobility in the channel is further improved.

Figure 4:
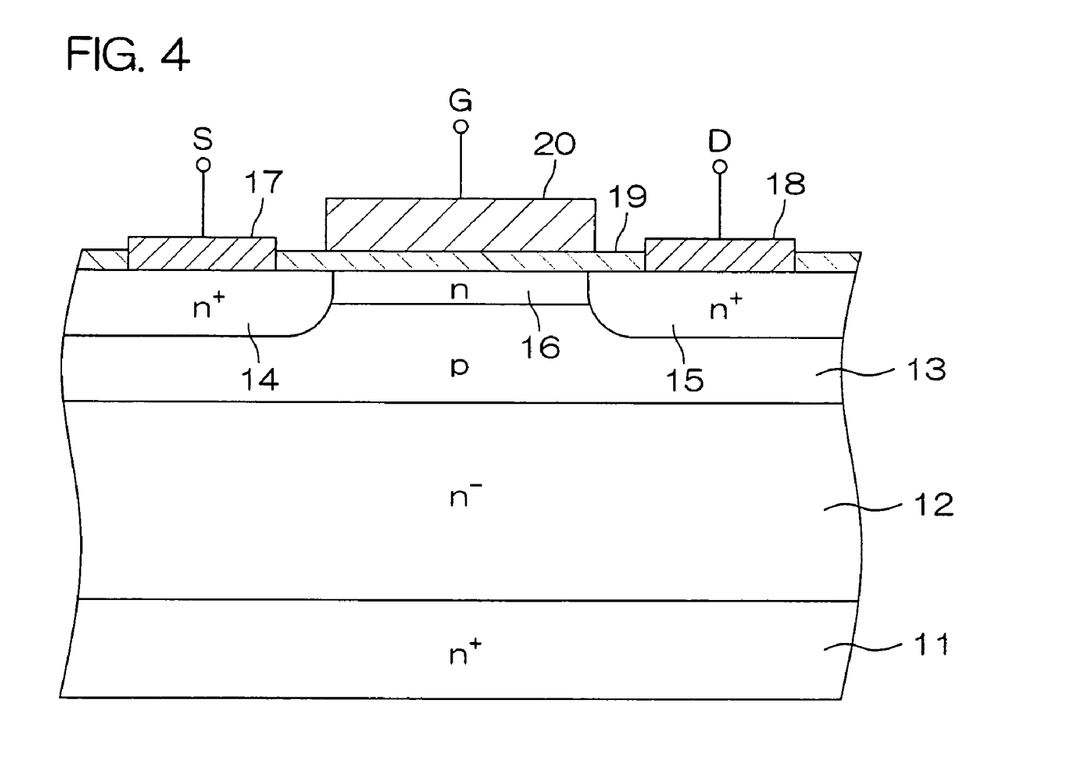
FIG. 4 is a sectional view schematically illustrating a construction of a semiconductor device according to another embodiment of the present invention.

FIG. 4 is a sectional view schematically illustrating the construction of a semiconductor device according to another embodiment of the present invention. The semiconductor device is an accumulation MOSFET, and employs an n⁺-type SiC semiconductor substrate 11 as a semiconductor substrate.

An n⁻-type SiC semiconductor epitaxial layer 12 having a lower impurity concentration than the n⁺-type SiC semiconductor substrate 11 is provided on a surface of the n⁺-type SiC semiconductor substrate 11. A p-type impurity region 13 is provided in a surface portion of the n⁻-type SiC semiconductor epitaxial layer 12. Further, an n⁺-type source region 14 and an n⁺-type drain region 15 are provided in a surface portion of the p-type impurity region 13 in properly spaced relation from each other. An n-type accumulation layer 16 is provided in a channel region between the n⁺-type source region 14 and the n⁺-type drain region 15.

The p-type impurity region 13 has a depth of 0.5 to 0.7 μm from a surface of the n⁻-type SiC semiconductor epitaxial layer 12. The n⁺-type source region 14 and the n⁺-type drain region 15 each have a depth of 0.2 to 0.3 μm from the surface of the n⁻-type SiC semiconductor epitaxial layer 12. The n-type accumulation layer 16 has a depth of 0.05 to 0.1 μm from the surface of the n⁻-type SiC semiconductor epitaxial layer 12.

A source electrode 17 and a drain electrode 18 are respectively provided on the n⁺-type source region 14 and the n⁺-type drain region 15. A gate oxide film 19 is provided on a portion of the n⁻-type SiC semiconductor epitaxial layer 12 between the source electrode 17 and the drain electrode 18, and a gate electrode 20 is provided on the gate oxide film 19.

Figure 5:
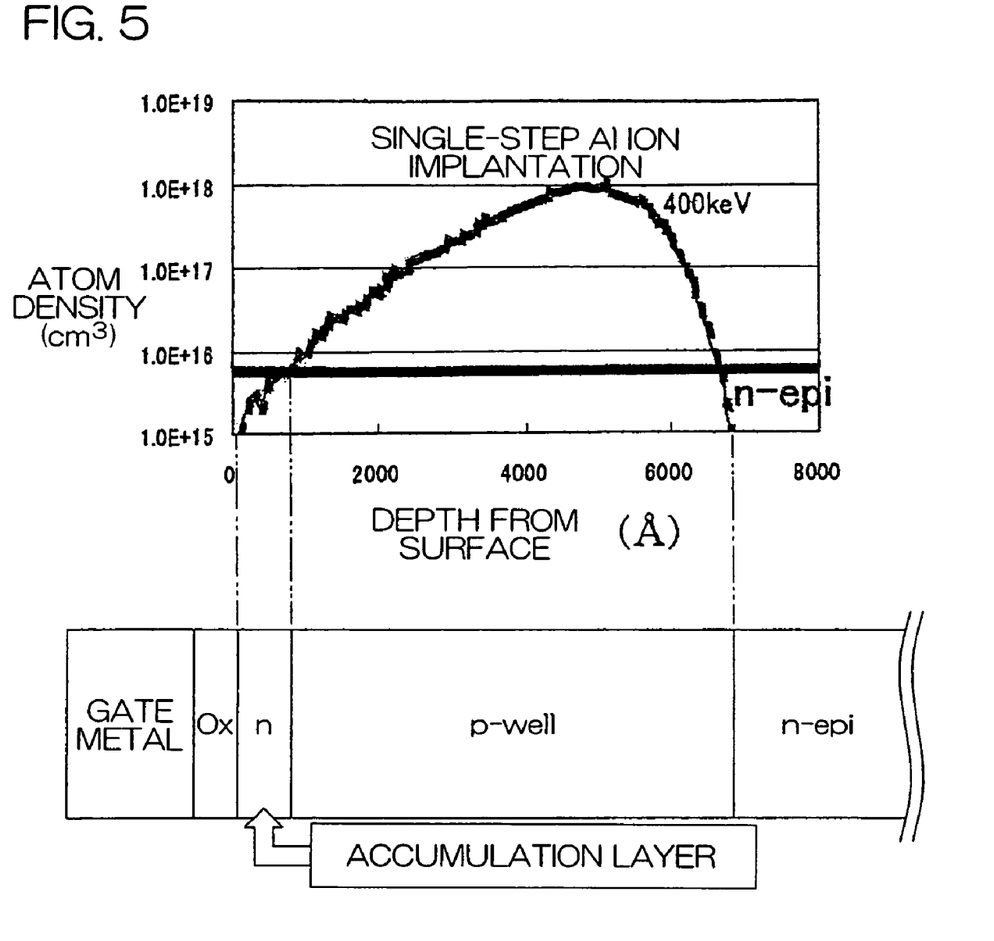
FIG. 5 is a diagram illustrating an impurity profile of a p-type impurity region of the semiconductor device shown in FIG. 4.

FIG. 5 is a diagram illustrating an impurity profile of the p-type impurity region 13. The p-type impurity region 13 is formed by forming the n⁻-type SiC semiconductor epitaxial layer 12 on the surface of the n⁺-type SiC semiconductor substrate 11 by epitaxial growth and then implanting, for example, aluminum (Al) ions as the p-type impurity into the surface portion of the n⁻-type SiC semiconductor epitaxial layer 12 with an implantation energy of 400 keV (constant). That is, the formation of the p-type impurity region 13 is achieved by single-step ion implantation with an implantation energy of 400 keV.

Where the p-type impurity region 13 is thus formed as having a depth of about 0.7 μm (7000 Å) from the surface of the n⁻-type SiC semiconductor epitaxial layer 12, the p-type impurity region 13 has an impurity profile such that a near deepest portion thereof (adjacent to a boundary between the p-type impurity region and the n⁻-type SiC semiconductor epitaxial layer 12) has a high peak p-type impurity concentration (atom density) on the order of not lower than $10^{18}/cm^3$ and the p-type impurity concentration continuously and gently decreases from the peak concentration level in the near deepest portion toward a surface, because the impurity introduced into the n⁻-type SiC semiconductor epitaxial layer 12 partly collides on SiC crystals to be reflected back. The p-type impurity concentration in a near surface is not higher than one hundredth the peak p-type impurity concentration, more specifically not higher than $5 \times 10^{15}/cm^3$. In the impurity profile, the p-type impurity concentration changes steeply in a portion deeper than the near deepest portion having the peak impurity concentration and changes much more gently in a portion between the near deepest portion and the surface than in the portion deeper than the near deepest portion.

Since the n-type impurity concentration (atom density) in the n⁻-type SiC semiconductor epitaxial layer 12 is generally constant on the order of $10^{16}/cm^3$, the p-type impurity concentration in the surface portion (channel region) of the p-type impurity region 13 is lower than the n-type impurity concentration. As a result, an n-type conductivity appears in the surface portion of the p-type impurity region 13 to form the n-type accumulation layer 16.

Figure 6:
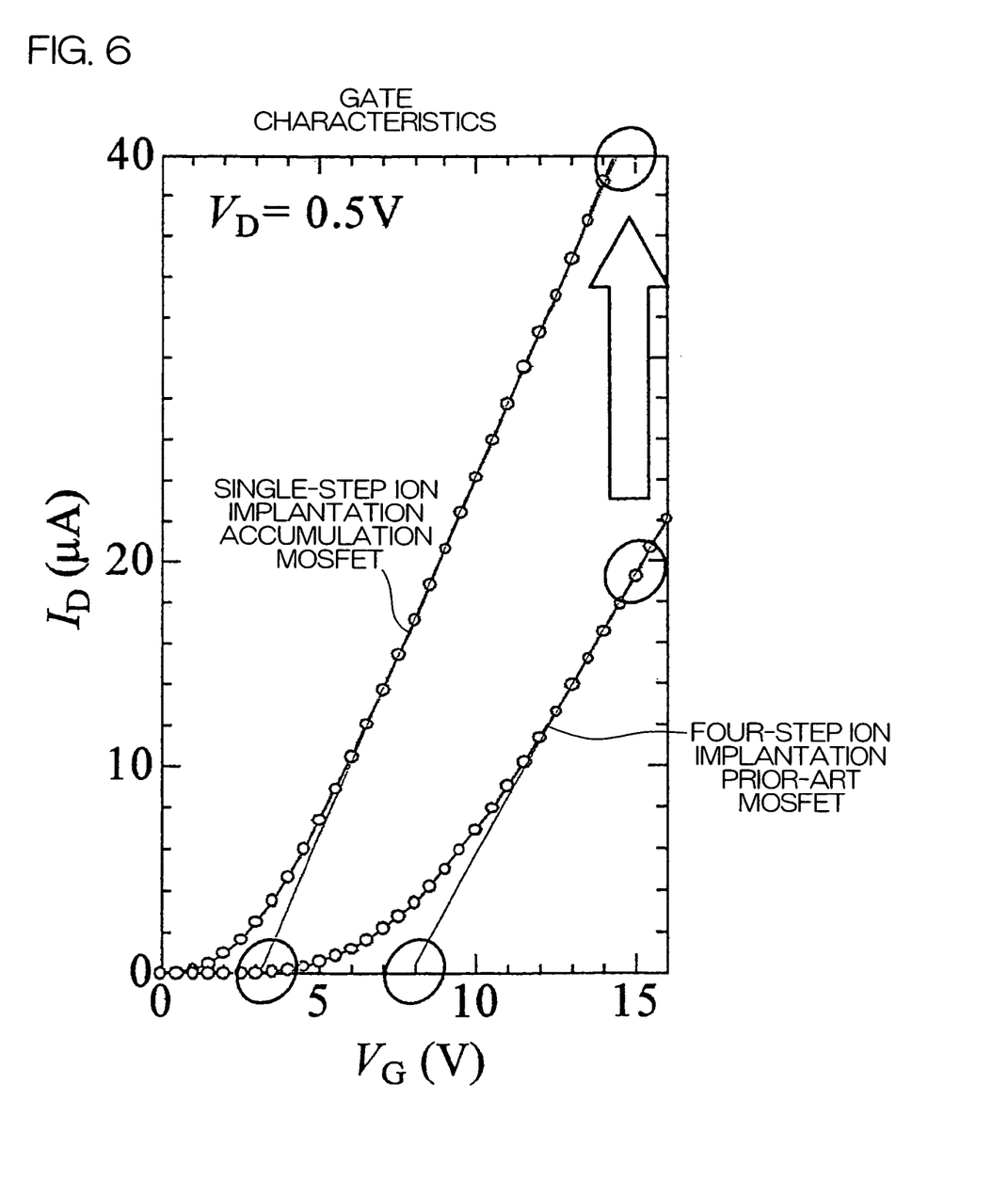
FIG. 6 is a graph illustrating gate characteristics of the semiconductor device shown in FIG. 4.

As shown in FIG. 6, the accumulation MOSFET with its n-type accumulation layer 16 thus formed has more excellent characteristics than a prior-art MOSFET having a p-type impurity region formed as having substantially the same depth as the p-type impurity region 13 in a surface portion of an n⁻-type SiC semiconductor epitaxial layer by performing ion implantation with four different levels of implantation energy (four-step ion implantation).

That is, the prior-art MOSFET has a threshold voltage of about 8.0V and a carrier mobility of about 18.3 cm²/Vs in the channel. Where a gate voltage is 15V, a drain current is about 19 μA. In contrast, the accumulation MOSFET has a reduced threshold voltage on the order of 3.3V. In addition, the threshold voltage is positive, so that the accumulation MOSFET is of a normally OFF type which is required for a power switching element. Further, carrier mobility in a channel is improved to about 24 cm²/Vs. In addition, a drain current is about 42 μm where a drain voltage is 15V, so that an ON resistance is reduced to one half as compared with the prior-art MOSFET.

A formation of a buried channel such as the n-type accumulation layer 16 may be achieved by forming an n-type layer by epitaxial growth after the formation of the p-type impurity region (e.g., Japanese Unexamined Patent Publication No. 10-308510). Alternatively, the formation may be achieved by performing multi-step ion implantation to selectively implant the n-type impurity into the p-type impurity region after the formation of the p-type impurity region (e.g., Japanese Unexamined Patent Publication No. 11-261061).

Where the buried channel is formed by the epitaxial growth, the epitaxial growth should be stopped at an initial stage to provide a thin n-type layer having a depth of about 0.1 to 0.2 μm. However, it is difficult to precisely control an impurity concentration and a depth at the initial stage of the epitaxial growth. Therefore, it is impossible to control the impurity concentration and the depth of the buried channel as designed, which presents a problem that an accumulation MOSFET is liable to be of a normally ON type.

In the ion implantation, it is possible to precisely control the depth of the buried channel. However, the n-type impurity is implanted with a high concentration to cancel the p-type conductivity of the p-type impurity region, so that the buried channel has a high impurity concentration. This results in a problem that the impurity concentration of the buried channel cannot be controlled as designed, because a rate of impurity activation by annealing after the ion implantation is unstable. The buried channel having a high impurity concentration also suffers from a problem that carriers are susceptible to coulomb scattering and, hence, carrier mobility in the channel is lower.

In contrast, the method according to this embodiment (involving the formation of the n-type accumulation layer 16) is free from the problem encountered where the buried channel is formed by the epitaxial growth. Further, the n-type accumulation layer 16 has a low impurity concentration, so that the accumulation MOSFET is manufactured as having a normally OFF characteristic as designed without an influence of a rate of the activation by the annealing. Further, the n-type accumulation layer 16 has a high carrier mobility with a smaller degree of coulomb scattering of the carriers.

While the two embodiments of the present invention have thus been described, the invention may be embodied in other ways. In the embodiments described above, the n-type SiC semiconductor substrate is employed by way of example, but the semiconductor device having the double diffused MOS structure can be manufactured in substantially the same manner even, for example, by employing a p-type SiC semiconductor substrate. It is also possible to manufacture a semiconductor device of a CMOS structure.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2004-54506 filed with the Japanese Patent Office on Feb. 27, 2004, the disclosure of which is incorporated herein by reference.

What is claimed is:

1. A semiconductor device of a double diffused MOS structure employing a silicon carbide semiconductor substrate, the device comprising:
    a silicon carbide semiconductor epitaxial layer provided on a surface of the silicon carbide semiconductor substrate and having a first conductivity which is the same conductivity as the silicon carbide semiconductor substrate;
    an impurity region formed by doping a surface portion of the silicon carbide semiconductor epitaxial layer with an impurity of a second conductivity, the impurity region having a profile such that a near surface thereof has a relatively low second-conductivity impurity concentration and a deep portion thereof has a relatively high second-conductivity impurity concentration, wherein a second-conductivity impurity concentration in an outermost surface portion of the impurity region is controlled to be lower than a first-conductivity impurity concentration in the silicon carbide semiconductor epitaxial layer;
    a further impurity region by doping a surface portion of the impurity region of the second conductivity with an impurity of the first conductivity; and
    a channel region having the first conductivity formed in the outmost surface portion between the epitaxial layer and the further impurity region of the first conductivity, an impurity concentration of the first conductivity in the channel region is lower than the second-conductivity impurity concentration in the deep portion of the impurity region of the second conductivity.

2. A semiconductor device manufacturing method for manufacturing a semiconductor device of a double diffused MOS structure employing a silicon carbide semiconductor substrate, the method comprising steps of:
    forming a silicon carbide semiconductor epitaxial layer having a first conductivity on a surface of the silicon carbide semiconductor substrate, the first conductivity being the same conductivity as the silicon carbide semiconductor substrate; and
    doping a surface portion of the silicon carbide semiconductor epitaxial layer with an impurity of a second conductivity to form an impurity region having a profile such that a near surface thereof has a relatively low second-conductivity impurity concentration and a deep portion thereof has a relatively high second-conductivity impurity concentration,
    wherein the surface portion of the silicon carbide semiconductor epitaxial layer is doped with the impurity of the second conductivity by single-step ion implantation in the impurity region forming step, the single-step ion implantation being performed with a single constant level of implantation energy, and
    wherein a first-conductivity impurity concentration in the epitaxial layer is higher than a second-conductivity impurity concentration in an outermost surface portion of the impurity region, so as to form a channel region having the first conductivity in the outermost surface portion of the impurity region, and
    wherein an impurity concentration of the first conductivity in the channel region is lower than the second-conductivity impurity concentration in the deep portion of the impurity region of the second conductivity.

3. The device of claim 1, wherein the further impurity region is spaced apart from peripheral edges of the impurity region of the second conductivity, such that side surfaces of the further impurity region come in contact with and are covered with the impurity region of the second conductivity.

4. The device of claim 1, wherein the channel region is disposed between the epitaxial layer and the further impurity region of the first conductivity, such that one side surface of the channel region comes in contact with the epitaxial layer and the other side surface of the channel region comes in contact with the further impurity region of the first conductivity.

5. The device of claim 1, wherein the deep portion of the impurity region includes a portion that is disposed directly under the further impurity region.

6. The method of claim 2, wherein the first-conductivity impurity concentration in the silicon carbide semiconductor epitaxial layer is constant, and the constant first-conductivity impurity concentration in the epitaxial layer is higher than the second-conductivity impurity concentration in an outermost surface portion of the impurity region.

7. The method of claim 2, further comprising a step of doping a surface portion of the impurity region of the second conductivity with an impurity of the first conductivity to form a further impurity region,
    wherein the further impurity region is spaced apart from peripheral edges of the impurity region of the second conductivity, such that side surfaces of the further impurity region come in contact with and is covered by the impurity region of the second conductivity.

8. The method of claim 7, wherein the deep portion of the impurity region includes a portion that is disposed directly under the further impurity region.

* * * * *

UNITED STATES PATENT AND TRADEMARK OFFICE
CERTIFICATE OF CORRECTION

PATENT NO.      : 7,622,741 B2                                    Page 1 of 1
APPLICATION NO. : 10/588103
DATED           : November 24, 2009
INVENTOR(S)     : Mineo Miura It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 158 days.

Signed and Sealed this

Twenty-sixth Day of October, 2010

David J. Kappos
*Director of the United States Patent and Trademark Office*